United States Patent [19]
McMurdie

[11] Patent Number: 6,100,008
[45] Date of Patent: Aug. 8, 2000

[54] POSITIVE PHOTORESIST WITH IMPROVED CONTRAST RATIO AND PHOTOSPEED

[75] Inventor: Neil D. McMurdie, Pittsburgh, Pa.

[73] Assignee: PPG Industries Ohio, Inc., Cleveland, Ohio

[21] Appl. No.: 09/152,776

[22] Filed: Sep. 14, 1998

Related U.S. Application Data

[60] Provisional application No. 60/058,821, Sep. 15, 1997.

[51] Int. Cl.[7] .............................. G03C 1/73; G03C 1/675; G03F 7/004
[52] U.S. Cl. ....................... 430/270.1; 430/906; 430/910; 430/907; 430/905
[58] Field of Search ................................. 430/270.1, 905, 430/907, 906, 910, 920

[56] References Cited

U.S. PATENT DOCUMENTS

| | | | |
|---|---|---|---|
| 5,476,750 | 12/1995 | Rahman et al. | 430/270.1 |
| 5,600,035 | 2/1997 | Kahle, II et al. | 568/932 |
| 5,733,479 | 3/1998 | Kahle, II et al. | 252/405 |
| 5,908,780 | 6/1999 | Nitta et al. | 430/270.1 |

OTHER PUBLICATIONS

CA 88:21572, Orientation Effects on Charge–Transfer Interactions, VIII. Diastereomeric 4,7–Dimethoxy–12,15–Dinitro [2.2]Paracyclophanes; Chem. Ber. (1977), 110(10), 3358–65.

CA 82:138696, (1974), (49/50), 4397–400; Orientation Effects in Charge Transfer Interactions. IV. The Two Diastereoisomers of 4,7–Dimethoxy–12,15–Dinitro [2.2] Paracyclophane.

Berichte Der Deutschen Chemischen Gesellschaft, vol. 110, 1977, Weinheim DE, pp. 3358–3365, H.A. Staab et al., "Diastereomere 4,7–Dimethoxy–12,15–Dinitro (2.2)Paracyclophane".

*Primary Examiner*—Janet Baxter
*Assistant Examiner*—Sin J. Lee

*Attorney, Agent, or Firm*—Paul S. Chirgott

[57] ABSTRACT

The present invention is a positive acting photoresist composition which includes a positive acting photoactive component and a dimethyl aniline component. The positive acting photoactive component includes at least one positive acting photoactive polymeric compound. The photoactive polymeric compound contains groups having the 2,6-dinitro structure

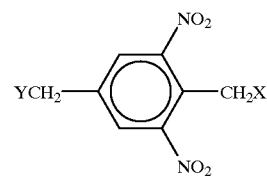

(1)

or a 2,5-dinitro structure

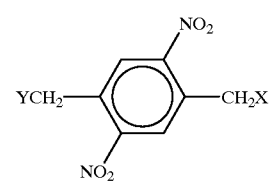

(2)

where X and Y may be the same or different member selected from the group consisting of: halogen, —OR, —O—$SO_2$R, —SR, —NRR', —OC=ONHR, —OC=OOR, —OSiRR'O and —OC=OR; and where R and R' may be hydrogen or any of a wide variety of organic substituents, including substituted or unsubstituted alkyl, aryl, substitutents. The photoactive component may also include a photoactive monomeric compound which contains groups having the 2,6-dinitro structure (1) and/or the 2,5-dinitro structure (2) set out above. The dimethyl aniline component includes a N,N-dimethyl aniline compound.

20 Claims, No Drawings

POSITIVE PHOTORESIST WITH IMPROVED CONTRAST RATIO AND PHOTOSPEED

This application claims the benefit of provisional application No. 60/058,821 filed Sep. 15, 1997.

FIELD OF THE INVENTION

The present invention relates to photoactive monomers, to oligomeric intermediates containing said monomers, to photoreactive polymers useful as positive acting photoresists, and to methods for making said polymers.

BACKGROUND OF THE INVENTION

Photoreactive polymers are useful as binder resins in photoresist compositions employed in photodevelopment of electronic components such as circuit boards and other products. Circuit boards are manufactured in a number of processing steps which rely on the use of photoreactive coatings (i.e., "photoresists") that photochemically produce a difference in solubility between the photoexposed areas and the unexposed areas. In general, two classes of photoresists exist: positive acting resists and negative acting resists. A positive acting resist becomes more soluble in a developer solution when exposed to actinic radiation, and a negative acting resist becomes less soluble in a developer solution when exposed to actinic radiation.

For many applications such as in the manufacture of circuit boards, a positive acting resist is often preferred over its negative acting counterpart. One reason for this preference is the presence of "through holes" in circuit boards. The term "through holes" refers to cylindrical passages from one surface of a circuit board to another surface. Since their purpose is to provide an electrical connection between two surfaces of the circuit board, the through holes are coated with a conductive material (e.g., copper). In order to retain its conductive integrity, the conductive material lining the walls of a through hole must be protected from etchants used in forming the circuit patterns. Many in the industry use photoresists for this purpose.

In one method of protecting the conductive material lining the walls of a through hole from etchants, a preformed, positive acting photoresist film is applied over the opening(s) of a through hole. In another method, a liquid, positive acting photoresist is applied onto the circuit board such that it coats the conductive material lining the walls of a through hole.

Once the photoresist is applied, it is irradiated so as to create a solubility difference between the irradiated and non-irradiated portions. The irradiation of the photoresist, in the case of circuit board manufacture, often occurs through a glass or plastic cover sheet. Radiation passing through such a cover sheet to reach the photoresist is predominantly that having wavelengths greater than approximately 315 nanometers. The principal wavelength used for irradiation of photoresists is the 365 nanometer wavelength of a mercury vapor ultraviolet lamp. Therefore, a useful photoresist for printed circuit board manufacture is preferably sensitive to radiation having wavelengths greater than 315 nanometers, particularly to radiation in the vicinity of 365 nanometers.

U.S. Pat. No. 5,600,035 discloses photoactive monomers and polymers which use nitro substituted moieties as the basis for positive acting resist photochemistries. Specifically, in that patent, a substantial improvement in resist performance is yielded by the use of photoreactive compounds synthesized from monomers including:

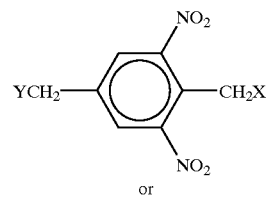

(1)

or

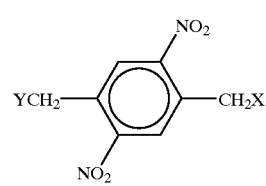

(2)

where X and Y may be the same or different member selected from the group consisting of: halogen, —OR, —O—SO$_2$R, —SR, —NRR', —OC=ONHR, —OC=OOR, —OSiRR'O and —OC=OR; and where R and R' may be hydrogen or any of a wide variety of organic substituents, including substituted or unsubstituted alkyl, aryl, substitutents, wherein the substitutents can be monomeric or polymeric. If further reaction to form adducts or polymers is desired, the R or R' groups may include a reactive group such as a hydroxyl group. After exposure to radiation such as ultraviolet (UV) light, the bond is broken between the carbon and the X in the CH$_2$X group, thus providing photoactivity to the compounds.

According to U.S. Pat. No. 5,600,035, the 2,6-dinitro structure (1) is preferred due to its high degree of photosensitivity. Thus, preferred embodiments of intermediates and polymers may be derived from the monomer:

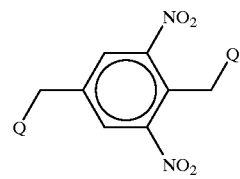

(3)

where Q is halogen and/or —OH. Also according to U.S. Pat. No. 5,600,035, the 2,6-dinitro-1,4-bis(dichloromethyl)-benzene species of structure (3) has been found to be particularly useful, and the corresponding diol species can be derived from the dichloro monomer. Both the chloride and hydroxyl groups are reactive with a wide variety of substances whereby intermediates and polymers can be synthesized from the dichloro or diol monomers of structure (3) or from the corresponding 2,5-dinitro monomers. The oligomers or polymers thus formed are highly photoreactive and find use as positive acting photoresists and the like. These polymers and oligomers also form part of the invention recited in U.S. Pat. No. 5,600,035. Those oligomers or polymers include the photoreactive groups as defined above and at least one ether, ester, urethane, carbonate, thio, or amino group or combinations thereof. Each of these substitutents may include a reactive group (e.g., OH) to enable further reaction or copolymerization, if desired.

U.S. Pat. No. 5,600,035 discloses that polymers can be prepared from monomers and intermediates having the defined bis(chloromethyl)dinitrobenzene or dinitrobenzene dimethanol structures which are hydrolytically and thermally stable to the processing conditions required for photoimaging, such as in the manufacture of circuit boards. That patent also discloses that polymers such as polyurethanes, polysulfides and polyethers can be produced and are known to be stable in electrocoating baths; and that polyesters, polyamines and polyquaternized amine polymers have also been prepared with the desirable dinitro groups. Optionally, the photoreactive polymers may include salt forming groups or may be blended with another polymer that has salt forming groups to permit aqueous dispersion and electrodeposition of the photoresist composition onto conductive substrates.

Novel, high yield syntheses of the aforementioned dinitrobenzene monomers having functional substitution at the 1,4 positions are also part of the invention recited in U.S. Pat. No. 5,600,035, as well as methods of making intermediates and polymers from those monomers. Notwithstanding the improvement in the art provided by U.S. Pat. No. 5,600,035, there is always a desire to improve a photoresist's photospeed and/or contrast ratio. As used herein, the term "photospeed," as it pertains to a photoresist, refers to the integrated dosage of actinic radiation (typically expressed in milliJoules/cm$^2$) required to effect a usable image transfer into the photoresist film. Also, the term "contrast ratio," as it pertains to a photoresist, refers to the difference in solubility between the exposed and unexposed portions of the film in an appropriate developer solution. The contrast ratio is a unitless number most easily calculated from the amount of time it takes a developer solution to completely dissolve unexposed film divided by the amount of time required to dissolve the exposed portion of the film. For positive acting resists, the contrast ratio is always greater than one with higher numbers being preferred.

SUMMARY OF THE INVENTION

One object of this invention is to provide a positive acting photoresist having an improved contrast ratio.

Another object of this invention is to provide a positive acting photoresist having improved photospeed.

These and other objects are achieved by a novel photoresist composition which comprises a positive acting photoactive component and a dimethyl aniline component. The positive acting photoactive component comprises at least one a positive acting photoactive polymeric compound. The photoactive polymeric compound contains groups having the 2,6-dinitro structure (1) or the 2,5-dinitro structure (2) set out above. The photoactive component may also include a positive acting monomeric compound which contains groups having the 2,6-dinitro structure (1) and/or the 2,5-dinitro structure (2) set out above. The dimethyl aniline component includes an N,N-dimethyl aniline compound.

DETAILED DESCRIPTION

The present invention is an improved photoresist composition which has enhanced contrast ratio and/or photospeed properties. This improved photoresist composition includes a positive acting photoactive component and a dimethyl aniline component.

The positive acting photoactive component includes at least one positive acting photoactive polymeric compound. The photoactive polymeric compound contains groups having the 2,6-dinitro structure (1) and/or the 2,5-dinitro structure (2). The photoactive component may also include at least one positive acting, photoactive monomeric compound which contains groups having the 2,6-dinitro structure (1) and/or the 2,5-dinitro structure (2). The portions of U.S. Pat. No. 5,600,035 which disclose positive acting photoactive polymeric and monomeric compounds are incorporated herein by reference.

Depending upon the type of positive acting photoresist being made, its positive acting photoactive component can be present in an amount ranging from about 10 to about 99 weight percent, wherein said weight percentage is based on the total weight of non volatile materials in the resulting photoresist composition. For example, if the resulting resist is a standard dissolution inhibitor resist, its positive acting photoactive component is typically present in an amount ranging from about 10 to about 35 weight percent, preferably from about 12 to about 30 weight percent, and more preferably from about 15 to about 25 weight percent. Moreover, if the resulting resist is a standard electrodepositable resist, its positive acting photoactive component is typically present in an amount ranging from about 20 to about 80 weight percent, preferably from about 30 to about 70 weight percent, and more preferably from about 40 to about 60 weight percent. Also, if the resulting resist is a standard main chain cleavage polymer resist, its positive acting photoactive component is typically present in an amount ranging from about 60 to about 99 weight percent, preferably from about 70 to about 97 weight percent, and more preferably from about 80 to about 95 weight percent.

The dimethyl aniline component includes at least one N,N-dimethyl aniline compound. While any suitable N,N-dimethyl aniline compound may be used when practicing this invention, typically, the N,N-dimethyl aniline compound is derived from a salt or free base compound having a molecular weight (Mn) not greater than about 2,000 and/or containing at least one N,N-dimethylaminophenyl substituent. If the dimethyl aniline compound is derived from a compound containing at least one N,N-dimethylaminophenyl substituent, preferably, the compound from which the dimethyl aniline compound is derived does not contain more than three one N,N-dimethylaminophenyl substituents, and more preferably not more than two N,N-dimethylaminophenyl substituents.

Compounds from which the dimethyl aniline compound can be derived could include, without limitation, any of the following: N,N-dimethyl aniline, alkyl or halo substituted N,N-dimethyl aniline, aryl substituted N,N-dimethylanilines, polycyclic aromatic dimethyl amino compounds such as 2-dimethylaminonaphthlene and N,N-dimethylamine containing dyes such as malachite green or crystal violet. Preferred compounds of this type are typically higher molecular weight species such as malachite green, N,N-dimethyl aniline, t-butyl N,N-dimethyl aniline and N,N-dimethyl naphthal amine.

Typically, the dimethyl aniline component is present in an amount not greater than about 5 weight percent, wherein said weight percentage is based on the total weight of non volatile materials in the resulting photoresist composition. If present in an amount greater than about 5 weight percent. Preferably, the dimethyl aniline component is present in an amount ranging from about 0.001 to about 5 weight percent, more preferably in an amount ranging from about 0.005 to about 3 weight percent, even more preferably in an amount ranging from about 0.01 to about 1 weight percent, and even still more preferably in an amount ranging from about 0.05 to about 0.5 weight percent.

Although not wishing to be bound by theory, it is believed that dinitro substitution in the benzyl group in the dinitro structures (1) and (2) increases photosensitivity compared to mononitro substitution compounds. Even further enhancement of sensitivity is believed to be yielded by the 2,6-dinitro substitution. Not only does the structure of 2,6-dinitro or 2,5-dinitro substitution around a benzyl group provide good quantum efficiency, but each photoreaction causes at least two changes to a polymer. First, the backbone of polymer undergoes main chain scission to lower molecular weight fragments upon exposure to actinic radiation. It is believed that this is what enhances the solubility of exposed portions of the polymer during the developing step of the photoimaging process. Secondly, there is the generation of a salt forming group that enhances the sensitivity of the photoexposed material to developer. These changes work in concert to give excellent photosensitivities.

The photochemistry relies on the photo-oxidation of the benzyl group by the nitro group upon exposure to actinic radiation. During the photo-oxidation reaction, the nitro group is reduced to a nitroso substituent. Nitroso compounds are reported in the literature to undergo a number of side reactions which have the potential to interfere with the imaging process. Foremost among these side reactions is the potential to form nitroso dimers that have the following general structures:

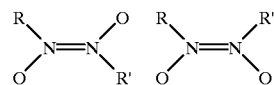

where R and R' may be the same or different and are an alkyl or aryl group.

Formation of a nitroso dimer in the exposed portion of the film would have a negative impact on the resist's contrast ratio because it negates the effect of main chain scission. Additionally, nitroso dimers are strong UV absorbers in the 365 nm range which also could hamper full exposure of the resist film.

The dinitro photoreactive groups of monomers employed to synthesize the positive acting photoactive polymer used when practicing the present invention are characterized by a benzene ring wherein at least one of the nitro groups is adjacent to a photo-scissionable group substituted on the ring. Photosensitivity of the scissionable group is enhanced by the adjacent nitro group (as in 2,5-dinitro substitution), and even greater photosensitivity is achieved in the case of two adjacent nitro groups (as in 2,6-dinitro substitution). The presence of one and preferably two nitro groups adjacent to the scissionable group also shifts peak sensitivity to longer wavelengths, e.g., toward the vicinity of 365 nanometers, which is a wavelength commonly used in commercial photoimaging processes.

In order to be incorporated into the positive acting photoactive polymer, the photoreactive groups have a plurality of copolymerizable functional groups. A preferred functional group is a hydroxyl group, and preferred intermediates of the present invention therefore are diols. Although functionality greater than two is seldom needed, it should be understood that such is not precluded by the present invention.

EXAMPLES

The present invention is more particularly described in the following examples which are intended as illustration only and are not intended to limit the scope thereof. Among other things, the following Examples illustrate how to prepare a positive acting photoresist composition which has an enhanced photospeed and contrast ratio.

Example 1

Synthesis of 2,6-Dinitro-1,4-Benzenedimethanol

This Example illustrates one method of making 2,6-dinitro-1,4-benzenedimethanol which was used in making a positive acting photoresist composition.

Under nitrogen, α, α'-Dichloro-p-xylene (75.0 g) in methylene chloride 50 mL) was added to a 2-liter flask equipped with mechanical stirring, a thermometer, and an ice bath. A precombined mixture containing concentrated suliric acid (200 mL), oleum (27–33%, 26 mL) and fuming nitric acid (250 mL) was added to the 2-liter flask over a one hour period. The addition rate of this precombined mixture was controlled so that the reaction temperature did not exceed 35° C.

After the addition was complete, the reaction was then stirred at 35° C. for one additional hour. Next, the resulting mixture was heated to 38° C. to distill off the methylene chloride and to drive the dinitration reaction. Once the methylene chloride had been removed, the reaction temperature was held at 38° C. for a four hour period.

Then, the reaction mixture was poured into two kilograms of ice, and the crude product was collected by filtration. The product was twice washed with water and recrystallized from ethanol to give pure 2,6-dinitro-1,4-bis(chloromethyl) benzene (43 g) with a melting point of 106° C.

The resulting 2,6-dinitro-1,4-bis(chloromethyl)benzene (60 g) was added to 90% formic acid (48 g) and dimethyl formamide (15 g) and heated to reflux. A solution of potassium hydroxide (35 g) in distilled water (100 g) was added over a one hour period. The reaction mixture was then held at reflux for 10 hours. A saturated aqueous sodium bicarbonate solution (300 g) was added and the reaction mixture was cooled to 10° C. with an ice bath. The resulting product was collected by filtration. A second recrystallization from distilled water yielded pure 2,6-dinitro-1,4-benzenedimethanol (43 g).

Example 2

Synthesis of an Aqueous Carbonate Developable Photoresist Polymer Containing 2,6-Dinitro-1,4-Benzenedimethanol This Example illustrates one method of making 2,6-dinitro-1,4-benzenedimethanol which was used in making a positive acting photoresist composition.

In the synthesis of this aqueous carbonate developable photoresist polymer, tetramethylxylyenediisocyanate (TMXDI, 355 g) was added under nitrogen over a one hour period to a three liter flask already containing 2,6-dinitro-1,4-benzenedimethanol (88 g), dimethyolpropionic acid (88 g), dibutyl tin dilaurate (1.5 g) and propyleneglycol monomethyl ether acetate (330 g) while the flask was maintained at a temperature of at 80° C. The 2,6-dinitro-1,4-benzenedimethanol was that prepared in accordance with the procedure set out in Example 1.

Once this addition was complete, the reaction mixture was held at 80° C. for one additional hour. Thereafter, a precombined mixture of Bisphenol A ethoxylate (93 g), 1,6-hexane diol (24 g) and propyleneglycol monomethyl ether acetate (135 g) was added to the three liter flask containing the reaction mixture over a two hour period. The resulting mixture was held at 80° C. until the NCO equivalent weight stalled. Finally, 16.0 g of a mixture of aliphatic alcohols was added to the three liter flask to quench the remaining isocyanate and produce an aqueous carbonate developable photoresist polymer which contains 2,6-dinitro-1,4-benzenedimethanol.

Example 3

Synthesis of 2,6-Dinitro-1,4-bis(4'-t-butylphenoxymethyl)benzene

This Example illustrates one method of making 2,6-dinitro-1,4- bis(4'-t-butylphenoxymethyl)benzene which was used in making a positive acting photoresist composition.

A mixture of 2,6-dinitro-1,4-bis(chloromethyl)benzene (33.1 g), 4-t-butylphenol (38.3 g), methylene chloride (200 g), and toluene (100 g) was heated to 45° C. under nitrogen with vigorous mechanical stirring. Into this mixture was added lithium hydroxide monohydrate (16.4 g), tetraethyl ammonium bromide (3.0 g) and deionized water (300 g). The resulting mixture was stirred for eight hours at 45° C. Gas chromatography showed that, after the eight hour period, the reaction was complete.

Hydrochloric acid (1.5 g) and methylene chloride (300 g) were then added to the completed reaction. The resulting mixture was poured into a separatory funnel, and the bottom organic layer was collected. After washing the organic fraction twice with deionized water, the organic fraction was concentrated under vacuum. The crude product was recrystallized from ethanol to give 21.5 g of 2,6-dinitro-1,4-bis(4'-t-butylphenoxymethyl)benzene.

Example 4

Formulation of a Positive Acting Photoresist

This Example illustrates one method of making a positive acting photoresist composition which can be used when practicing this invention.

The photoresist resin of Example 2 (43.2 g), 2,6-dinitro-1,4-bis(4'-t-butylphenoxymethyl)benzene of Example 3 (4.5 g), and FC-430® surfactant (0.033 g) were dissolved in propylene glycol monomethyl ether acetate (37 g). FC-430® surfactant is a non-ionic, fluorocarbon surfactant commercially available from 3M Company of St. Paul, Minn., USA.

The resulting formulation was applied to a sheet of ½ ounce copper laminate using a #16 wirewound drawdown bar. After a 5 minute flash and a 5 minute bake at 120° C., a dry film thickness of 0.28 mil was obtained. Using a Kepro exposure unit, the coated laminate was exposed to a dosage 400 mJ/cm$^2$ UV light through a silver halide on mylar phototool. The image was developed by being immersed for 2 minutes in a 1% potassium carbonate solution maintained at 40° C.

Example 5

Use of a Dimethyl Aniline Component in Positive Acting Photoresists

This Example illustrates one method of making a positive acting photoresist composition containing a dimethyl aniline component. One particular dimethyl aniline component used in this Example was malachite green carbinol base. Another particular dimethyl aniline component used in this Example was other substituted aromatic amine compounds.

When synthesizing the photoresist containing malachite green carbinol base, 0.05 g of malachite green carbinol base was added to 85.3 g of the formulated liquid resist described in Example 4. Drawdowns on copper laminate were prepared as described in Example 4 with a dry film thickness of 0.29 mil. Using identical exposure and development conditions, high resolution images were obtained with a development time of 50 seconds. Exposure to 200 mJ/cm of UV light resulted in a high resolution image after a two minute development time in 1% aqueous potassium carbonate maintained at 40° C.

When synthesizing the photoresist containing other substituted aromatic amine compounds, a variety of materials were tested for efficacy. In each experiment, 0.05 g of the amine compound was added to 85.3 of a stock resist prepared as described in Example 4. Drawdowns were prepared and tested as in Example 4. Coated copper panels were also prepared with a sample of the same resist stock solution without any amine additives as a control. Table 1 below summarizes the results from these tests

TABLE 1

Tests To Determine The Effect of Aromatic Amines on Photospeed and Contrast Ratio

| Panel # | Amine Additive | Exposure Dosage | Development Tim | Improvement? |
|---|---|---|---|---|
| 1 | None | 400 mJ/cm2 | 120 sec @ 40° C. | Control |
| 2 | None | 200 mJ/cm2 | 300 sec @ 40° C. | Control |
| 3 | Malachite Green | 400 mJ/cm2 | 50 sec @ 40° C. | Yes |
| 4 | Malachite Green | 200 mJ/cm2 | 120 sec @ 40° C. | Yes |
| 5 | Crystal Violet | 400 mJ/cm2 | 240 sec @ 40° C. | No |
| 6 | Leuco Malachite Green | 400 mJ/cm2 | 110 sec @ 40° C. | Yes |
| 7 | 4-t-butyl-N,N-dimethylaniline | 400 mJ/cm2 | 60 sec @ 40° C. | Yes |
| 8 | 4-Trityl Aniline | 400 mJ/cm2 | 300 sec @ 40° C. | No |
| 9 | 4,4'-(Dimethylamino)benzhydrol | 400 mJ/cm2 | 110 sec @ 40° C. | Yes |
| 10 | N,N-Dimethyl naphthyl Amine | 400 mJ/cm2 | 60 sec @ 40° C. | Yes |
| 11 | 3-Benzyloxy Aniline | 400 mJ/cm2 | 240 sec @ 40° C. | No |
| 12 | 4-Phenoxy Aniline | 400 mJ/cm2 | 240 sec @ 40° C. | No |

The results illustrated in Table 1 demonstrate that materials which contain at least one, but not more than three, N,N-dimethyl aniline groups improve the contrast ratio and photospeed of photoresists which have ortho nitro benzyl groups as the photoactive moiety. Specifically, the column identified as "Development Time," tabulates the time it took to develop the photoresist after being exposed to the level of UV light tabulated in the column identified as "Exposure Dosage." Accordingly, when compared to the control photoresist developed by being exposed to a 400 mJ/cm$^2$ dosage (i.e., Panel 1), the photoresists coated onto Panels 3, 6, 7, 9 and 10 had a shorter development time.

The results of TABLE 1 clearly show that, if the photoresists coated onto Panels 3, 6, 7, 9 and 10 were subjected to a 400 mJ/cm² dosage for 120 seconds at 40° C., their contrast ratio would be better than that of Control Panel 1 Therefore, the photoresists coated onto Panels 3, 6, 7, 9 and 10 had a better contrast ratio than that of Panel 1.

On the other hand, if the contrast ratio of Control Panel 1 was desired, the photoresists coated onto Panels 3, 6, 7, 9 and 10 would be able to reach this level, when subjected to a 400 mJ/cm² dosage, quicker than the time it took for Panel 1 to reach this level. Therefore, the photoresists coated onto Panels 3, 6, 7, 9 and 10 had a faster photospeed than that of Panel 1.

The invention has been described with reference to particular embodiments for the sake of providing the best mode of carrying out the invention, but it should be understood that other alternatives and variations known to those of skill in the art may be resorted to without departing from the scope of the invention as defined by the claims which follow.

That which is claimed is:

1. A positive acting photoresist composition comprising:
   (a) a positive acting photoactive component which comprises at least one positive acting, photoactive polymeric compound containing groups having a structure:

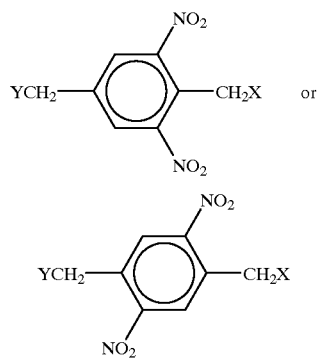

where X and Y may be the same or different member selected from the group consisting of: halogen, —OR, —O—SO₂R, —SR, —NRR', —OC=ONHR, —OC=OOR, —OSiRR'O and —OC=OR; and
   where R and R' may be the same or different member selected from the group consisting of: hydrogen and substituted or unsubstituted alkyl, aryl or aralkyl substitutents, and
   (b) a dimethyl aniline component which comprises at least one N,N-dimethyl aniline compound.

2. The photoresist composition of claim 1 wherein at least one of X and Y is a hydroxyl group.

3. The photoresist composition of claim 2 wherein both X and Y are a hydroxyl group.

4. The photoresist composition of claim 1 wherein the photoactive component further comprises at least one positive acting, photoactive monomeric compound which contains groups having the 2,6-dinitro structure (1) or the 2,5-dinitro structure (2).

5. The photoresist composition of claim 1 wherein, when R or R', or both, are a substituted alkyl, aryl or aralkyl substitutent, the substitution includes a hydroxyl group.

6. The photoresist composition of claim 1 wherein at least one of X and Y is a urethane, carbonate, carboxylic acid ester, ether or sulfide.

7. The photoresist composition of claim 1 having 2,6-dinitro substitution and wherein at least one of X and Y is a hydroxy groups.

8. The photoresist composition of claim 1 having 2,6-dinitro substitution and wherein both X and Y are hydroxyl groups.

9. The photoresist composition of claim 1 wherein the N,N-dimethyl aniline compound is derived from any salt or free base compound having a molecular weight not greater than about 2,000.

10. The photoresist composition of claim 1 wherein the N,N-dimethyl aniline compound contains at least one N,N-dimethylaminophenyl substituent.

11. The photoresist composition of claim 10 wherein the N,N-dimethyl aniline compound contains not more than three N,N-dimethylaminophenyl substituents.

12. The photoresist composition of claim 11 wherein the N,N-dimethyl aniline compound is derived from any salt or free base compound having a molecular weight not greater than about 2,000.

13. The photoresist composition of claim 1 wherein the N,N-dimethyl aniline compound is selected from the group consisting of: N,N-dimethyl aniline, alkyl or halo substituted N,N-dimethyl aniline, aryl substituted N,N-dimethylanilines, polycyclic aromatic dimethyl amino compounds, 2-dimethylaminonaphthlene and N,N-dimethylamine containing dyes.

14. The photoresist composition of claim 1 wherein the N,N-dimethyl aniline compound is selected from the group consisting of: malachite green, N,N-dimethyl aniline, t-butyl N,N-dimethyl aniline and N,N-dimethyl naphthal amine.

15. The photoresist composition of claim 1 wherein the N,N-dimethyl aniline compound is selected from the group consisting of: malachite green, t-butyl N,N-dimethyl aniline and N,N-dimethyl naphthal amine.

16. The photoresist composition of claim 1 wherein the photoactive polymeric compound contains groups having the structure:

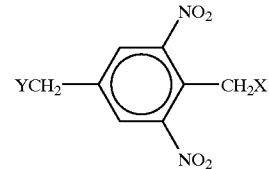

where X and Y are hydroxyl groups, and
   wherein the N,N-dimethyl aniline compound is derived from any salt or free base compound having a molecular weight not greater than about 2,000.

17. The photoresist composition of claim 16 wherein X and Y are the same as each other, and wherein the N,N-dimethyl aniline compound is selected from the group consisting of: N,N-dimethyl aniline, alkyl or halo substituted N,N-dimethyl aniline, aryl substituted N,N-dimethylanilines, polycyclic aromatic dimethyl amino compounds, 2-dimethylaminonaphthlene and N,N-dimethylamine containing dyes.

18. The photoresist composition of claim 17 wherein the dimethyl aniline compound is selected from the group consisting of: malachite green, t-butyl N,N-dimethyl aniline and N,N-dimethyl naphthal amine.

19. The photoresist composition of claim 16 wherein X and Y are different from each other, and wherein the dimethyl aniline compound is selected from the group consisting of: N,N-dimethyl aniline, alkyl or halo substituted N,N-dimethyl aniline, aryl substituted N,N-dimethylanilines, polycyclic aromatic dimethyl amino compounds, 2-dimethylaminonaphthlene and N,N-dimethylamine containing dyes.

20. The photoresist composition of claim 19 wherein the dimethyl aniline compound is selected from the group consisting of: malachite green, t-butyl N,N-dimethyl aniline and N,N-dimethyl naphthal amine.

* * * * *